United States Patent [19]

Reiner et al.

[11] Patent Number: 4,532,574
[45] Date of Patent: Jul. 30, 1985

[54] ELECTRIC METER CENTER

[75] Inventors: Richard A. Reiner, Colgate; John J. Siebenlist, Milwaukee; Robert J. Clarey, Brookfield, all of Wis.

[73] Assignee: Eaton Corporation, Cleveland, Ohio

[21] Appl. No.: 499,018

[22] Filed: May 27, 1983

[51] Int. Cl.³ .............................................. H02B 1/20
[52] U.S. Cl. ................................. 361/365; 339/126 R; 361/356
[58] Field of Search .................. 174/65 R, 65 G, 66; 324/110, 156; 361/355, 356, 365–375, 358; 339/126 R

[56] References Cited

U.S. PATENT DOCUMENTS

| | | | |
|---|---|---|---|
| 1,813,331 | 7/1931 | Wadsworth | 361/365 |
| 2,370,043 | 2/1945 | Johansson | 361/367 |
| 3,280,379 | 10/1966 | Ellsworth et al. | 361/353 |
| 3,707,653 | 12/1972 | Coffey et al. | 361/365 |
| 3,746,936 | 7/1973 | Coffey et al. | 361/365 |
| 4,001,653 | 1/1977 | Olashaw et al. | 361/353 |

Primary Examiner—A. D. Pellinen
Assistant Examiner—Gregory D. Thompson
Attorney, Agent, or Firm—C. H. Grace; L. G. Vande Zande

[57] ABSTRACT

A meter center enclosure (4) is divided into a metering section (8) and service disconnect section (10) by a barrier (6,12,14) which is laterally supported along a back wall of the enclosure by brackets (30) cooperatively engaging slots (22) in the barrier. Grooved insulator supports (24) are slidingly received in the slots (22) and are locked in a forward position by the brackets (30). Bus conductors (26,28) extend from the metering section (8) into the service disconnect section (10) through openings in the insulators (24) and are supported by the insulators (24). In one embodiment, insulator (24) provides the sole support (24e) for a service disconnect circuit breaker, and connectors (44) are provided for the bus conductors (26,28) which may selectively receive either plug-in (CBP) or bolt-in (CBB) circuit breakers. In another embodiment, the insulator (52) cooperates with a reversible bracket (58) to support a selected one of two dimensionally different circuit breakers (CB'). The enclosure (4) is provided with a large, continuous wire opening (70) covered by a removable panel (64) which has individual wire receiving holes for attachment to the enclosure after the meter center is mounted in place.

15 Claims, 9 Drawing Figures

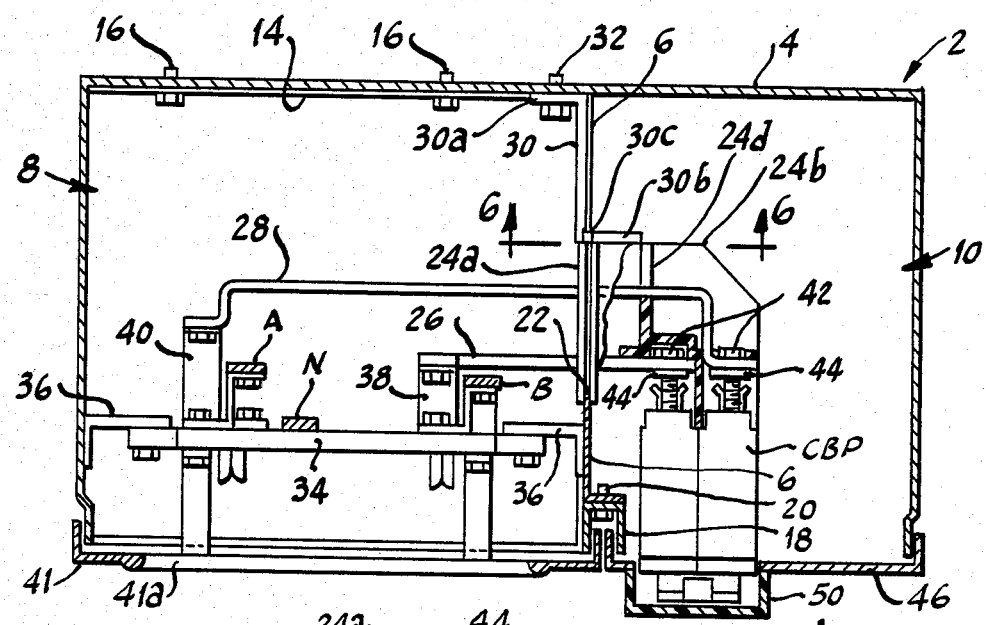
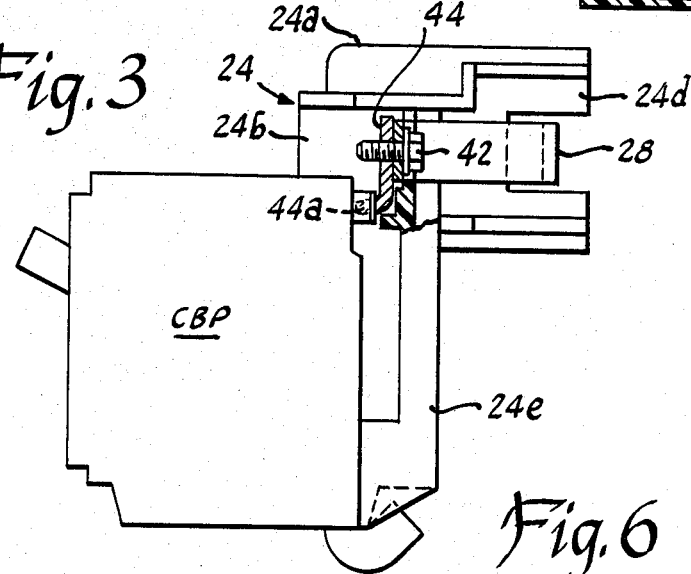
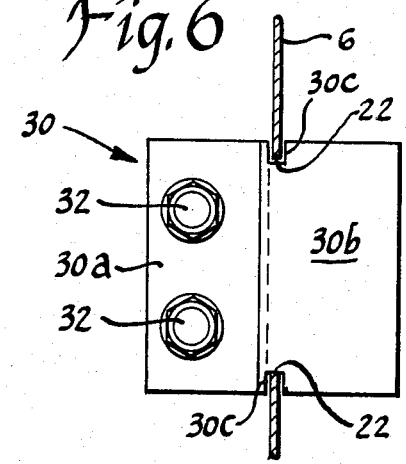

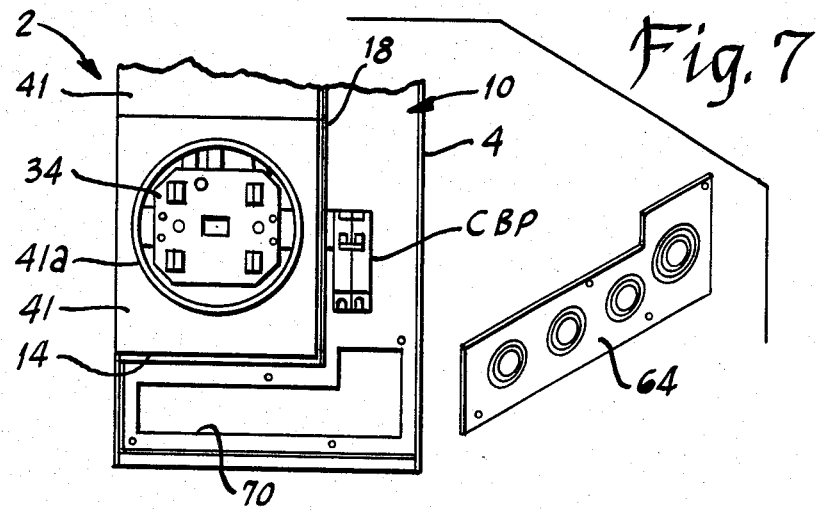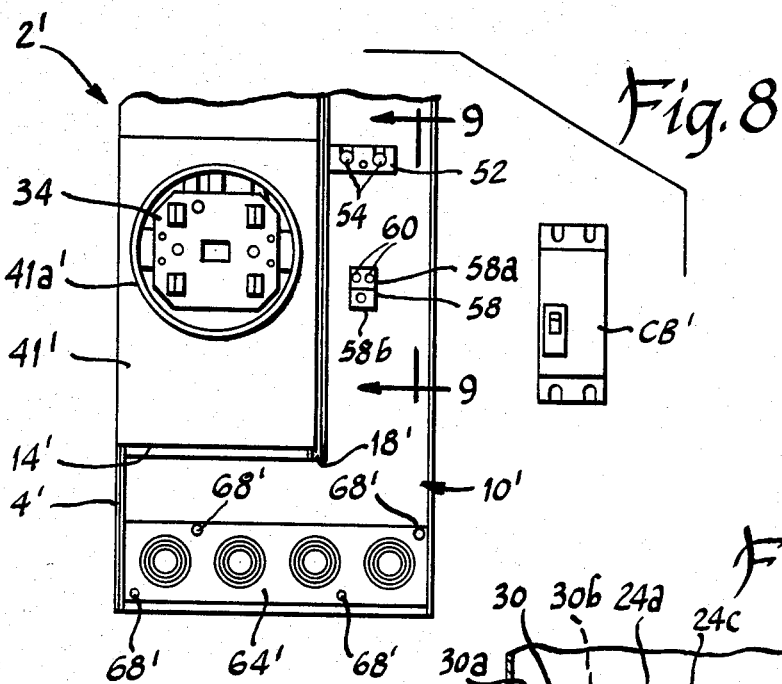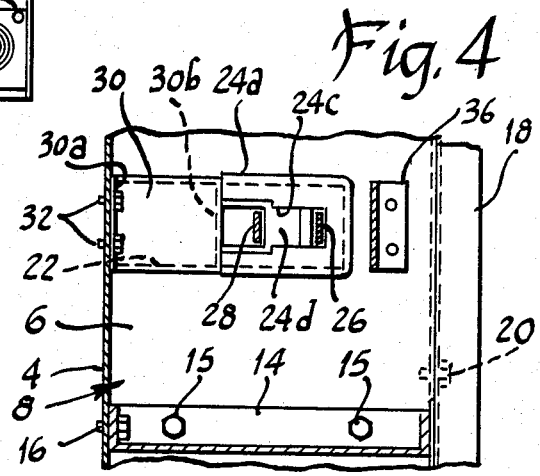

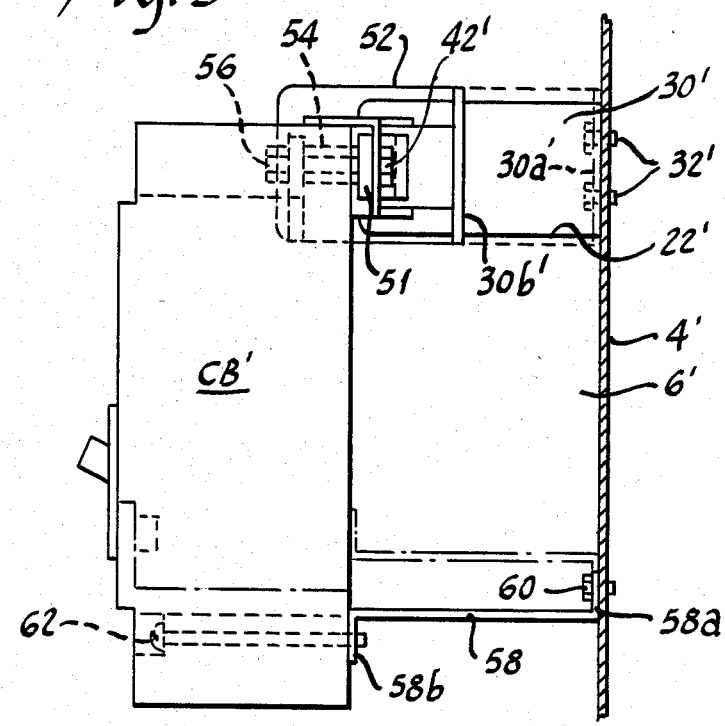
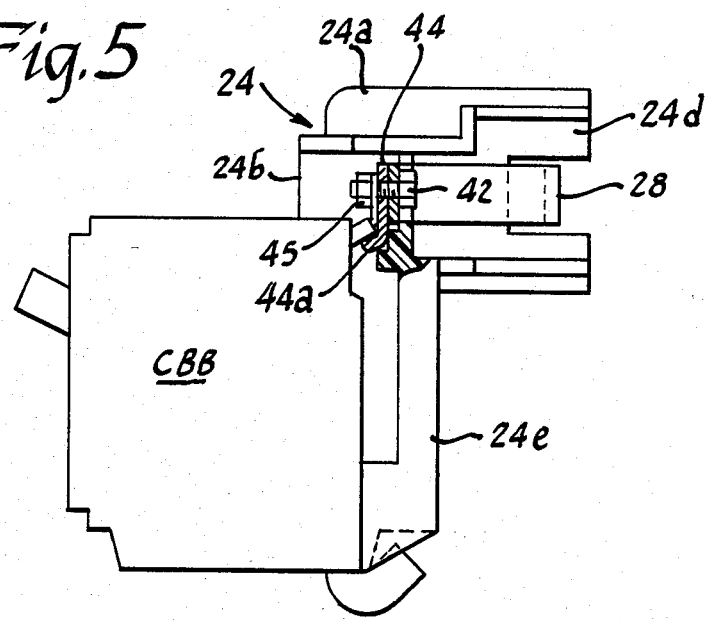

ELECTRIC METER CENTER

BACKGROUND OF THE INVENTION

This invention relates to enclosed electrical apparatus, and particularly to wall-hung enclosures for electrical apparatus. More particularly, the invention relates to improvements in electric meter center enclosures which are subdivided into separate sections for receiving service disconnect apparatus and for receiving electrical metering apparatus.

A meter center comprises a cabinet or enclosure which contains a plurality of meter receptacles commonly referred to as meter sockets and corresponding service disconnect devices such as circuit breakers, fusible switches or the like, in an arrangement whereby several customers may be individually provided with metered electrical service from a common enclosure. Design specifications for meter centers are determined or influenced by several entities. Electric utilities require that the metered portions of such enclosures be sealed in a tamper-proof manner so as to prevent unmetered electric power to be drawn therefrom. Installation and service requirements on the part of the utility and contractor dictate that each customer's incoming electric service may be worked on by authorized personnel with a minimum or no disruption in electric service to other customers served by the same meter center and with a minimal amount of disassembly of the meter center enclosure. The electrical apparatus distributor requires that the meter center be sufficiently flexible in design whereby the number of different units required to be stocked by the distributor may be held to a minimum. In providing a meter center which meets all of the aformentioned and other requirements, such as those of regional and national codes, the meter center manufacturer also has a basic competitive requirement that the resulting structure be capable of efficient and economical manufacture. A significant factor in this regard is to simplify and reduce manufacturing assembly time. This may be accomplished by minimizing the number of separate, distinct parts required to construct a meter center and by designing parts which facilitate assembly of the structure.

SUMMARY OF THE INVENTION

The invention disclosed herein provides a meter center wherein the enclosure is separated into a metering section and a service disconnect section by a barrier structure which includes a barrier, insulators for lining openings in the barrier for bus conductors which extend between the two sections, and closure members for sealing off openings in the barriers, all of which cooperate in a unique manner to facilitate assembly of these members to the enclosure. The insulators additionally support the ends of the bus conductors within the service disconnect section and in one embodiment, the individual insulators provide a complete mounting panel for a disconnect circuit breaker. This mounting panel has the capability to receive both plug-in and bolt-in circuit breakers without changing connector parts of the panelboard. In a second embodiment, a separate support bracket cooperates with the insulator for providing the necessary mounting support for a service disconnect circuit breaker, the bracket being mounted to the enclosure within a single set of mounting screw holes in one of two predetermined orientations to provide support for circuit breakers of different dimensions.

The invention also provides a meter center enclosure which has an opening in an exterior wall covered by a removable panel which is removed when mounting the meter center to a structural wall of a building wherein electric service conductors are in established positions on the wall, thereby to facilitate insertion of the conductors through the larger opening. The panel may be provided with knock-outs or other suitable openings to accommodate the respective service conductors, and subsequently placed over the conductors and reattached to the mounted enclosure.

BRIEF DESCRIPTION OF THE DRAWINGS

FIG. 2 is a transverse cross-sectional view of the meter center at a meter position taken along the line 2—2 of FIG. 1;

FIG. 3 is a view taken along the line 3—3 of FIG. 1 showing an insulating support for a service disconnect circuit breaker mounted on an insulating support when viewed from the service disconnect side of the meter center;

FIG. 4 is a sectional view taken along the line 4—4 of FIG. 1 showing the aforementioned insulating support viewed from the metering section side of the meter center;

FIG. 5 is a view similar to FIG. 3 but showing an alternative form of circuit breaker mounted on the insulating support;

FIG. 6 is a cross-sectional view taken along the line 6—6 of FIG. 2 showing a multi-function bracket of the meter center enclosure;

FIG. 7 is a front elevational view of the lower meter position of the meter center shown in FIG. 1 but having the cover for that meter position in place and showing a wiring access panel removed from the enclosure;

FIG. 8 is a front elevational view of the lower meter position of an alternate embodiment of meter center which is capable of handling higher currents, showing an alternative insulating support member and cooperating bracket and showing a circuit breaker removed therefrom; and FIG. 9 is a view taken along the line 9—9 of FIG. 8 showing the aforementioned circuit breaker mounted in place upon the cooperating insulating support and cooperating bracket.

DESCRIPTION OF THE PREFERED EMBODIMENT

Figure 1:
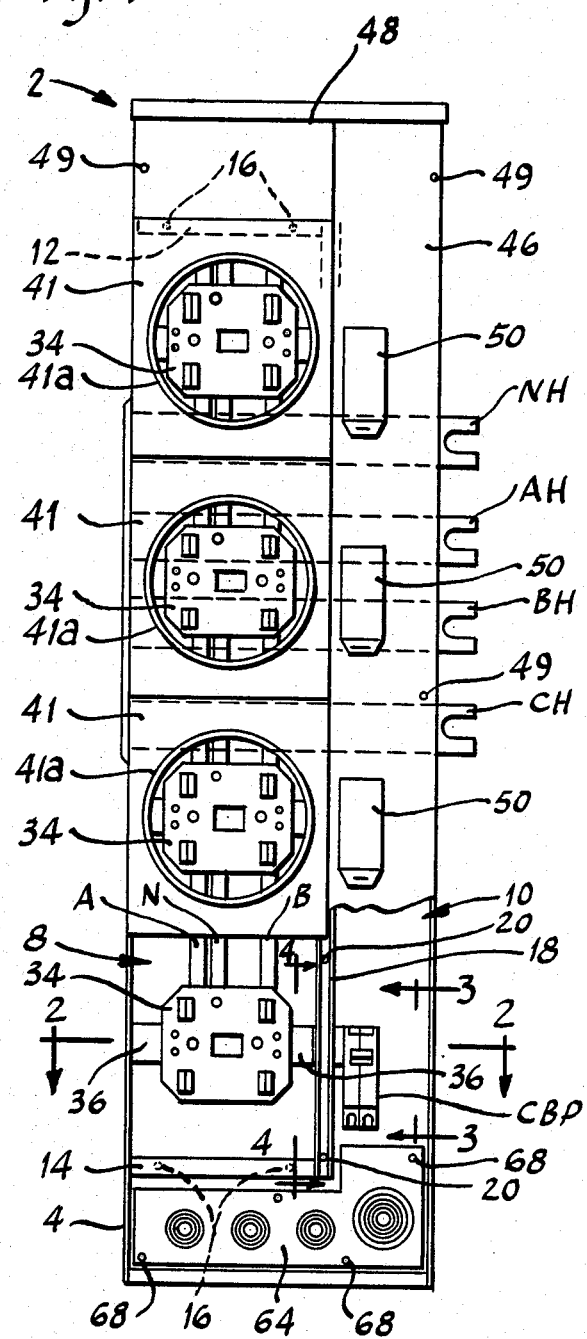
FIG. 1 is a front elevational view of a meter center constructed in accordance with this invention and having a cover removed from a lower meter position and a lower portion of a service disconnect section cover broken away.

Referring to the drawings and particularly to FIGS. 1 and 2 thereof, the electric meter center 2 of this invention comprises a box-like sheet metal enclosure 4 which has an open front. A barrier 6 is mounted within the enclosure to divide the meter center into a metering section 8 and a service disconnect section 10. The barrier 6 includes upper and lower end plates 12 and 14, respectively, which have rearwardly extending inner flanges bolted to the vertically extending barrier 6 by screws 15 (FIG. 4) from the metering section side of the barrier. The barrier is mounted within the enclosure 4 by fastening the end plates 12 and 14 to the rear wall of the enclosure 4 with screws 16 from the interior of the metering section. The vertical wall of barrier assembly 6 has a narrow right-angle flange formed along its outer end as can be seen in FIG. 2 to which a U-shaped channel 18 is attached along the entire length by a plurality of screws 20. The vertical wall of barrier 6 is also provided with rearwardly extending slots or openings 22 (FIGS. 2 and 4) which are located at each meter position and are open to the rear edge of the barrier 6.

An insulator 24, comprising a U-shaped flanged lend 24a having a peripheral groove extending along the three edges thereof and a circuit breaker support panel portion 24b extending perpendicularly to the flanged portion 24a is inserted within a respective opening 22 from the open end at the rear of the barrier 6 wherein the groove in the flange 24a engages the edges of the opening 22 (FIGS. 2 and 4). The open slot formed by the flanged end 24a and openings in the support panel portion 24b of the insulator receive bus conductors 26 and 28 which extend between the metering section 8 and service disconnect section 10 as will be described more fully later. A plurality of Z-shaped brackets 30 are mounted to the rear wall of the enclosure 4 by pairs of screws 32 which extend through openings in a first offset flange 30a of the respective brackets 30 from the interior of metering section 8. Referring to FIGS. 2, 4 and 6, the brackets 30 are positioned in vertical alignment with the openings 22 in barrier 6. Brackets 30 are each provided with a second offset leg 30b at the forward end thereof, and each leg 30b has a pair of slots 30c formed in the respective upper and lower edges thereof immediately adjacent the central web of the bracket. Slots 30c receive the upper and lower edges of the openings 22 as the barrier 6 is positioned within the enclosure 4 to anchor and position the interior end of the vertical wall of the barrier assembly 6 against lateral movement. The forward surface of leg 30b engages the rear of insulator 24 to hold the insulator firmly against the forward edge of the opening 22. Thus the bracket 30 closes off the remainder of the opening 22 immediately to the rear of insulator 24 and functions to locate the rear edge of barrier 6 laterally within the enclosure 4 and to locate the insulator 24 forwardly with respect to the enclosure 4. While not specifically shown herein, the rear portion of the opening 22 could be made larger whereby the insulator 24 could be inserted into the larger rear portion of the opening with the barrier 6 in place within the enclosure and then slid forward into the narrower portion of the opening to engage the peripheral groove with the edges of the opening 22 to position the insulator and the bracket 30, which would be made correspondingly larger than the enlarged rear portion of the opening 22 could subsequently be positioned in place and attached to the rear wall of the enclosure 4.

Meter centers of the type disclosed herein are manufactured in various sizes having capacities for receiving two to six meters. In the particular embodiment disclosed in FIG. 1., the metering section 8, defined by end plates 12 and 14, barrier 6 and the left wall of enclosure 4, is divided into four meter positions. Each meter position has a meter socket assembly 34 secured to brackets 36 within the enclosure 4 and barrier 6. The meter sockets 34 are electrically attached by suitable connectors to vertical bus bars A and B and a fifth or sixth jaw vertical bus bar N as shown in FIGS. 1 and 2. Meter sockets 34 also have connectors 38 and 40 which extend rearwardly to connect with bus conductors 26 and 28, respectively, as seen in FIG. 2. Each meter center 2 is provided with horizontally extending feeder bus bars AH, BH, CH and NH which are suitably shielded and which have electrical connections (not specifically shown) to the respective vertical bus bars A, B, C (where used) and N. Each meter position is also provided with an individually removable cover 41 to enclose the front of the metering section 8, each cover 41 being provided with a circular flange 41a defining an opening for an electric meter.

As seen best in FIG. 4, the U-shaped flange 24a of molded insulator 24 defines a slot 24c which is open to the rear of the flange portion. Bus conductor 26 extends laterally through the slotted opening 24c and rests upon a forward facing surface of the insulator within the service disconnect section 10. Bus conductor 28 is spaced rearwardly of conductor 26 and extends around a rearwardly extending rib 24d of the insulator 24 and then projects forwardly and again offset laterally to project through an opening in the front surface of the insulator and rests upon that surface. The ends of the conductors 26 and 28 are provided with clearance holes for bolts 42 which extend through the bus conductors from the rear and take into threaded holes in connector plates 44 (FIGS. 3 and 5). The threaded shank of bolt 42 projects substantially beyond the forward surface of connector plate 44 to serve as a threaded post for receiving the captive nut 45 of a bolt-in circuit breaker CBB for making electrical connection thereto as shown in FIG. 5. The connector plate 44 has a tab 44a which extends angularly forward from the lower edge to serve as the male plug-in connector portion for making electrical connection with a plug-in circuit breaker CBP as shown in FIG. 3. Screw 42 and tab 44a are horizontally aligned within each breaker position on insulator 24 and are vertically spaced as shown in FIGS. 3 and 5. The forward angle of projection 44a is such that it provides clearance for the angularly offset and insulated portion of the terminal of the bolt-in circuit breaker as seen in FIG. 5. With this construction of connector plate 44, a plug-in circuit breaker CBP or a bolt-in circuit breaker CBB may be selectively used on the insulator support 24 without necessitating separate, distinct connector plates for each variety of breaker, and enabling interchangeability of the breaker type in the field. The projecting support portion 24b of insulator 24 has a depending panel portion 24e as seen best in FIGS. 3 and 5 which serves as a mounting rail for the plug-in and bolt-in circuit breakers. In a well known manner, breakers of this type are provided with a hook which engages the rail portion to securely mount one end of the breaker and then the connector end is pivoted into engagement with the respective plug-in or bolt-in connector. It can be seen from the foregoing that the insulator 24 provides a means for ready attachment of the insulator to the barrier 6, provides an insulating lining for the respective openings 22 through which bus conductors 26 and 28 extend, provides an insulated support for the ends of bus conductors 26 and 28 within the service disconnect section and provides the sole means of support for the respective terminal and hook ends of the disconnect circuit breaker.

The service disconnect section 10 of the meter center 2 is provided with a cover 46 which comprises an elongated C-shaped channel extending the full height of enclosure 4 and has lateral extensions 48 welded thereto at the top and bottom to cover the spaces above and below end plates 12 and 14, respectively. The lower portion of cover 46 is broken away in FIG. 1 and therefor only the upper extension 48 is shown. The cover is attached to housing 4 by screws 49 which engage suitable projections (not shown) within the enclosure 4. The cover 46 is also provided with openings through which the service disconnect circuit breakers project, the openings and circuit breakers being concealed by hinged covers 50.

Referring to FIGS. 8 and 9, an alternate embodiment of meter center is shown which is rated for greater current capacity than that of meter center 2 shown in FIGS. 1-7. In this alternate embodiment, like elements have been given the same reference number, but the like reference numbers for the latter embodiment have been primed. In FIG. 8 the lower meter position is shown with the cover 41' attached. It will be appreciated by comparing cover 41' with covers 41 of meter center 2, that each meter position for the meter center 2' is somewhat longer in its vertical dimension. Moreover, the circuit breaker CB' which serves as the service disconnect switch for meter center 2' is a large frame circuit breaker.

The insulating support member 24 is replaced by an insulating support member 52 which is similar to insulator 24 except that it does not have the depending breaker support portion equivalent to portion 24e. The outer ends of respective bus conductors 51 similar to bus conductors 26 and 28 are received and supported on the front surface of the insulator 52. The outer end of only one conductor 51 is visible in FIG. 9. The outer ends of both conductors 51 have hexagonal bolt-on electrical connectors 54 attached thereto by screws 42' which extend through clearance holes in the respective bus conductors to threadably engage tapped holes in the connectors 54. Bolts 56 extend through clearance holes in terminal plates of the breaker and threadably engage the connectors 54 from the front to electrically connect the circuit breaker CB' to the bus conductors 51 and to position the upper end of the circuit breaker CB' with respect to the meter center. The lower end of the circuit breaker CB' is supported upon a Z-shaped bracket 58 which has first and second offset legs 58a and 58b, respectively, extending in opposite directions at opposite ends of the central web of the bracket. Offset leg 58a is provided with a pair of holes through which a pair of screws 60 extend to threadably engage a pair of holes in the rear wall of the enclosure 4. Offset leg 58b has a single threaded hole therein which receives a mounting screw 62 for the circuit breaker CB' therein to fixedly position the lower end of that circuit breaker. The meter center 2' is made to accept circuit breakers of two different sizes, one of which is dimensionally shorter than the other. To accomplish this with a minimum number of distinct parts, bracket 58 may be mounted in the reverse manner, i.e., rotated 180° about its forwardly extending axis, so that forward leg 58b containing the threaded hole now projects upwardly as shown in the dot-dash line position. When in this position, the threaded hole will be in alignment to receive the mounting screw 62 for the alternative shorter circuit breaker.

Meter centers, particularly unitized meter centers of the type disclosed herein which may be ganged together to provide multiple metering capability, are customarily hung directly on a structural wall of the building in which they are used. In many instances, the conduit which leads the electric service wires to the individual building units or areas which the meter center is to serve are already in position on the wall at the time the meter center is being installed. In this case, a number of wires are generally projecting from the wall within the space of the horizontal width of the meter center. To facilitate mounting the meter center to the wall while at the same time bringing the wires through the respective openings for subsequent feeding to the respective circuit breakers, the enclosure is provided with a removable panel 64 as seen in FIGS. 1 and 7. The panel is held in place by a plurality of screws 68 and may be removed prior to installing the meter center, thereby to expose a larger continuous opening 70 therebehind. Wires coming from the various units may be readily fed through this large continuous opening 70 and the meter center may be readily positioned to the wall without having positioning movement of the meter center impeded by feeding the wires through small, individual holes. After the meter center is mounted in place, the panel 64 may have individual holes formed therein to receive the respective groups of wires. These holes may be of the frangible knock-out variety which are readily formed, or may be cut or drilled into the panel as desired. By threading the wires through the proper hole of the panel 64, the panel 64 may be subsequently brought into position over opening 70 and attached in place by screws 68 to provide the necessary holes for receiving bushings or connectors for the respective conduits.

I claim:

1. An electric meter center comprising, in combination:
   an enclosure having a metering section and a service disconnect section separated by a barrier;
   an opening in said barrier;
   electric conductors extending from said metering section through said opening to project into said service disconnect section;
   insulating means for supporting the projecting ends of said conductors in said service disconnect section;
   means in said service disconnect section for mounting a service disconnect circuit breaker; and
   multiple connector means on said projecting ends of said electric conductors comprising first means for effecting electrical connection with a plug-in circuit breaker and second means for effecting electrical connection with a bolt-in circuit breaker alternatively mounted in a same location as said plug-in circuit breaker without necessitating modification of said connector means.

2. The invention defined in claim 1 wherein said first connector means comprises a raised projection.

3. The invention defined in claim 1 wherein said second connector means comprises a raised threaded post.

4. The invention defined in claim 3 wherein said first connector means comprises a raised projection extending angularly away from said threaded post.

5. The invention defined in claim 1 wherein said insulating means and said means for mounting a service disconnect circuit breaker comprise a unitary insulator mounted to said barrier at said opening, said insulator having an integral mounting panel extending into said service disconnect section for mounting said circuit breaker, said mounting panel supporting the projecting ends of said conductors for effecting electrical connection with said circuit breaker at one end of said circuit breaker and having attachment means spaced from said conductor ends for mechanical attachment of an opposite end of said circuit breaker whereby said insulator provides a singular support structure for said circuit breaker.

6. The invention defined in claim 5 wherein said insulator comprises means engaging edges defining said opening in said barrier for mounting said insulator to said barrier.

7. An electric meter center comprising, in combination:
- an enclosure having a metering section and a service disconnect section;
- a barrier separating said sections;
- an opening in said barrier;
- electric conductors extending from said metering section through said opening and projecting into said service disconnect section;
- insulating means attached to said barrier at said opening for receiving projecting ends of said conductors and supporting said conductors in said service disconnect section;
- cooperable means on said insulating means and said barrier engagable upon sliding movement of said insulating means toward one end of said opening for attaching said insulating means to said barrier means; and
- means mounted within said metering section extending along said barrier toward said one end of said opening for overlying and closing off a remaining portion of said opening and for preventing sliding movement of said insulating means toward an opposite end of said opening.

8. The invention defined in claim 7 wherein said insulating means comprises a mounting panel extending into said service disconnect section for mounting a service disconnect circuit breaker, said mounting panel comprising said supported projecting ends of said conductors for effecting electrical connection with said circuit breaker at one end of said circuit breaker, and attachment means spaced from said conductor ends for mechanical attachment of an opposite end of said circuit breaker, whereby said insulating means provides a singular support structure for said circuit breaker.

9. The invention defined in claim 8 wherein said cooperable means comprises edges defining said opening in said barrier and means on said insulating means for engaging opposite sides of said barrier at said edges.

10. The invention defined in claim 9 wherein said insulating means comprises a one-piece insulator having a slotted flange portion received within said opening in said barrier, said flange portion defining an aperture through which said conductors are received by said insulating means, and said means mounted within said metering section comprises a bracket larger than said opening extending along said barrier for closing off said opening and a transversely formed leg engaging said insulator for preventing sliding movement of said insulator toward said opposite end of said opening.

11. The invention defined in claim 10 wherein said bracket has slots formed in said leg, said slots receiving opposed edges of said opening in said barrier.

12. The invention defined in claim 11 wherein said bracket comprises a transversely formed flange adjacent said opposite end of said opening for attachment of said bracket to said enclosure.

13. The invention defined in claim 7 wherein said insulating means locates said conductor projecting ends within said service disconnect section for mounting one end of a service disconnect circuit breaker, and further comprising a bracket mounted within said service disconnect section spaced from said insulating means for mounting an opposite end of said circuit breaker, said bracket having a first leg with oppositely directed transverse second and third legs at opposite ends of said first leg, said second leg being attached to said enclosure and said third leg providing mounting means for said circuit breaker, and wherein said bracket may be rotated 180° about said first leg for attachment to said enclosure in one of two positions for providing a mounting means for a selected one of two different circuit breakers.

14. An electric meter center comprising, in combination:
- an enclosure having a metering section and a service disconnect section separated by barrier means, said enclosure being adapted to be mounted on a structural wall;
- an opening in an exterior wall of said enclosure in said service disconnect section, said exterior wall being adjacent said structural wall; and
- a panel removably attached to said enclosure wall for covering said opening, said panel being removable for facilitating threading electrical service conductors through said opening when mounting said enclosure on said structural wall with respect to previously located positions of said service conductors, and wherein said panel is formed with holes corresponding to the locations of said service conductors for separate positioning of said panel over said service conductors and subsequent reattachment to said enclosure.

15. The invention defined in claim 14 wherein said panel is provided with frangible knock-outs.

* * * * *